(12) United States Patent
Stewart et al.

(10) Patent No.: US 7,766,640 B2
(45) Date of Patent: Aug. 3, 2010

(54) CONTACT LITHOGRAPHY APPARATUS, SYSTEM AND METHOD

(75) Inventors: Duncan R. Stewart, Menlo Park, CA (US); Wei Wu, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1391 days.

(21) Appl. No.: 11/203,551

(22) Filed: Aug. 12, 2005

(65) Prior Publication Data

US 2010/0021577 A1 Jan. 28, 2010

(51) Int. Cl.
*G03B 27/02* (2006.01)
*G03B 27/62* (2006.01)

(52) U.S. Cl. .................. 425/112; 264/293; 355/78; 355/75

(58) Field of Classification Search .................. None
See application file for complete search history.

(56) References Cited

U.S. PATENT DOCUMENTS

| | | | |
|---|---|---|---|
| 5,160,959 A | 11/1992 | Everett et al. | |
| 6,294,450 B1 | 9/2001 | Chen et al. | |
| 6,482,742 B1 | 11/2002 | Chou | |
| 6,713,238 B1 | 3/2004 | Chou et al. | |
| 6,719,915 B2 | 4/2004 | Willson et al. | |

FOREIGN PATENT DOCUMENTS

| | | |
|---|---|---|
| EP | 0953878 | 11/1999 |
| EP | 1376235 | 1/2004 |
| WO | WO 02/07199 | 1/2002 |
| WO | WO0207199 | 1/2002 |

OTHER PUBLICATIONS

D. J. Resnick et al., "Imprint lithography for integrated circuit fabrication," J. Vac. Sci. Technol., B 21(6), Nov./Dec. 2003, pp. 2624-2631.

Xing Cheng et al., "One-step lithography for various size patterns with a hybrid mask-mold," Microelectronic Engineering, 71, pp. 288-293, Jan. 2004.

*Primary Examiner*—Daborah Chacko Davis

(57) ABSTRACT

A contact lithography apparatus, system and method use a deformation to facilitate pattern transfer. The apparatus, system and method include a spacer that provides a spaced apart parallel and proximal orientation of lithographic elements, such as a mask and a substrate, when in mutual contact with the spacer. One or more of the mask, the substrate and the spacer is deformable, such that deformation thereof facilitates the pattern transfer.

31 Claims, 8 Drawing Sheets

CONTACT LITHOGRAPHY APPARATUS, SYSTEM AND METHOD

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA972-01-3-0005 awarded by the Defense Advanced Research Projects Agency.

CROSS-REFERENCE TO RELATED APPLICATIONS

N/A

BACKGROUND

1. Technical Field

The invention relates to semiconductors and the fabrication thereof. In particular, the invention relates to contact and/or imprint lithography used to define one or both of micro-scale and nano-scale structures during semiconductor fabrication.

2. Description of Related Art

Photographic contact lithography and imprint lithography are examples of two lithography methodologies for defining micro-scale and nano-scale structures that generally involve direct contact between a patterning tool (e.g., mask, mold, template, etc.) and a substrate on which the structures are to be fabricated. In particular, during contact lithography, the patterning tool (i.e., mask) is aligned with and then brought in contact with the substrate or a pattern receiving layer of the substrate. Similarly, in imprint lithography, the patterning tool (i.e., mold) is aligned with the substrate after which the pattern is printed on or impressed into a receiving surface of the substrate. With either method, alignment between the patterning tool and the substrate general involves holding the patterning tool a small distance above the substrate while lateral and rotational adjustments (e.g., x-y translation and/or angular rotation) are made to a relative position of the tool and/or substrate. The patterning tool is then brought in contact with the substrate to perform the lithographic patterning.

In both of contact lithography and imprint lithography, an ultimate alignment accuracy as well as an achievable patterning resolution may be adversely affected by a degree to which the patterning tool and substrate are both mutually parallel and proximal during the alignment process. In addition, alignment accuracy may suffer as a result of drift or slip in the relative positioning of the aligned patterning tool and substrate that may occur as the tool is brought into contact with the substrate following alignment.

Accordingly, it would be desirable to have an approach to providing and maintaining a relatively parallel and proximal relationship between the patterning tool and the substrate during lateral and rotational alignment. Furthermore, it would be useful to provide a way of minimizing alignment drift and/or slip during contacting of the patterning tool and substrate following alignment. Such an approach would solve a long-standing need in the areas of contact lithography and imprint lithography.

BRIEF SUMMARY

In some embodiments of the present invention, a contact lithography apparatus is provided. The contact lithography apparatus comprises a mask having a patterned area with a lithographic pattern; and a spacer disposed between the mask and a substrate being patterned. The spacer provides a spaced apart parallel and proximal orientation of the mask and the substrate when the mask and the substrate are in mutual contact with the spacer. One or more of the mask, the substrate, and the spacer is deformable, such that deformation facilitates pattern transfer.

In other embodiments of the present invention, a contact lithography system is provided. The contact lithography system comprises a contact lithography module and a contact mask aligner that supports the contact lithography module. The contact lithography module comprises a spacer and a plurality of lithographic elements. The spacer is located between elements of the plurality. The spacer provides a spaced apart parallel and proximal orientation of the elements during an alignment of the elements by the aligner. A deformation in the module provides a pattern transfer while the aligner holds elements in alignment.

In other embodiments of the present invention, a method of contact lithography is provided. The method comprises orienting a lithographic mask and a substrate being patterned in a spaced apart parallel relationship using a dimensioned spacer. The mask and the substrate are in mutual contact with the spacer. The method further comprises inducing a deformation of one or more of the mask, the substrate and the spacer such that the mask and the substrate are brought into direct contact for pattern transfer.

Certain embodiments of the present invention have other features in addition to and/or in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

The embodiments of the present invention facilitate patterning a substrate using lithography involving contact between a patterning tool and a substrate. In various embodiments, the present invention employs one or more spacers between the patterning tool and the substrate to establish a parallel and proximal alignment therebetween. The parallel and proximal alignment provided by the spacers is readily maintained during lateral and or rotational adjustments between the patterning tool and the substrate to establish a desired alignment of the tool and the substrate. In addition, according to various embodiments of the present invention, a flexure or deformation of one or more of the patterning tool, the substrate, and the spacer facilitates the contact between the substrate and the patterning tool. Furthermore, the flexure-facilitated contact has little or no adverse effect on the previously established lateral and rotational alignment according to various embodiments of the present invention.

According to some embodiments of the present invention, the parallel and proximal alignment using spacers may reduce problems of alignment and stability related to vibration and temperature in contact lithography. For example, in some embodiments, a mutual contact between elements, such as the mask, the spacer and the substrate, during alignment may result in the mask and the substrate being at essentially the same temperature, thus reducing alignment errors associated with temperature differences among the elements. In some embodiments, the mask, the spacer, and the substrate may react to vibration essentially as a single unit, thus reducing, and in some instances minimizing, differential vibration-induced alignment errors that are present in conventional contact lithography apparatuses and systems.

Herein, the term 'deformation' generally includes within its scope one or both of a plastic deformation and an elastic deformation. As used herein, 'plastic deformation' means an essentially non-reversible, non-recoverable, permanent change in shape in response to an applied force. Further, as used herein, 'plastic deformation' includes a deformation resulting from a brittle fracture of a material under normal stress (e.g., a cracking or shattering of glass) as well as plastic deformations that occur during shear stress (e.g., bending of steel or molding of clay). Also, as used herein, 'elastic deformation' means a change in shape in response to an applied force wherein the change in shape is essentially temporary and/or generally reversible upon removal of the force. Herein, the term 'flexure' has the same meaning as 'deformation' and the terms are used interchangeably as are 'flex' and 'deform'; 'flexible' and 'deformable'; and 'flexing' and 'deforming', or the like.

Herein, the term 'deformation' further generally includes within its scope one or both of a passive deformation and an active deformation. Herein, 'passive deformation' refers to deformation that is directly responsive to an applied deforming force or pressure. For example, essentially any material that can be made to act in a spring-like manner either by virtue of a material characteristic and/or a physical configuration or shape may be passively deformable. As used herein, the term 'active deformation' refers to any deformation that may be activated or initiated in a manner other than by simply applying the deforming force. For example, a lattice of a piezoelectric material undergoes active deformation upon application of an electric field thereto independent of an applied deforming force. A thermoplastic that does not deform in response to an applied deforming force until the thermoplastic is heated to a softening point is another example of active deformation.

Further herein, the term 'contact lithography' generally refers to essentially any lithographic methodology that employs a direct or physical contact between means for providing a pattern or patterning tool and means for receiving the pattern or substrate, including a substrate having a pattern receiving layer, without limitation. Specifically, 'contact lithography' as used herein includes, but is not limited to, various forms of photographic contact lithography, X-ray contact lithography, and imprint lithography.

For example, in photographic contact lithography, a physical contact is established between a photomask (i.e., the patterning tool) and a photosensitive resist layer on the substrate (i.e., the pattern receiving means). During the physical contact, visible light, ultraviolet (UV) light, or another form of radiation passing through the photomask exposes the photoresist. As a result, a pattern of the photomask is transferred to the substrate.

In imprint lithography, a mold (i.e., the patterning tool) transfers a pattern to the substrate through an imprinting process, for example. In some embodiments, a physical contact between the mold and a layer of formable or imprintable material on the substrate (i.e., the pattern receiving means), transfers the pattern to the substrate. Imprint lithography, as well as a variety of applicable imprinting materials, are described in U.S. Pat. No. 6,294,450 to Chen et al. and U.S. Pat. No. 6,482,742 B1 to Chou, both of which are incorporated herein by reference.

For simplicity herein, no distinction is made between the substrate and any layer or structure on the substrate (e.g., photoresist layer or imprintable material layer) unless such a distinction is necessary for understanding. As such, the pattern receiving means is generally referred to herein as a 'substrate' irrespective of whether a resist layer or a formable layer may be employed on the substrate to receive the pattern. Moreover, the patterning tool (e.g., photomask, X-ray mask, imprint mold, template) is generally referred to herein as a 'mask' for simplicity of discussion and not by way of limitation.

Figure 1:
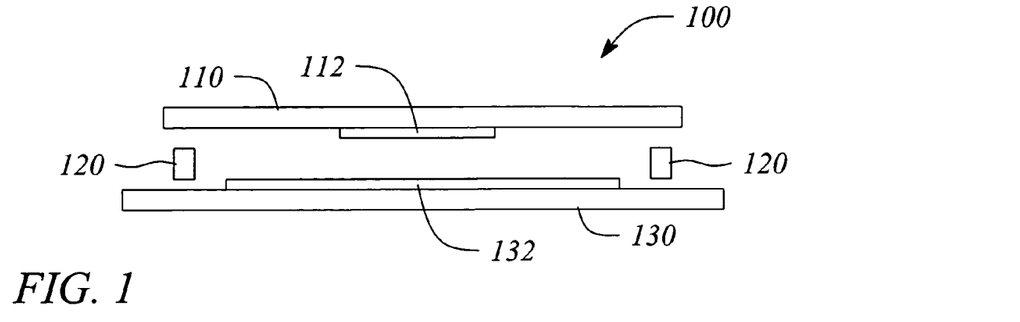
FIG. 1 illustrates a side view of a contact lithography apparatus according to an embodiment of the present invention.

FIG. 1 illustrates a side view of a contact lithography apparatus 100 according to an embodiment of the present invention. The contact lithography apparatus 100 comprises a patterning tool or 'mask' 110 and one or more spacers 120. The contact lithography apparatus 100 copies, prints, or otherwise transfers a pattern from the mask 110 to a substrate 130. In particular, a direct contact between the mask 110 and the substrate 130 is employed during pattern transfer.

In the contact lithography apparatus 100, the spacers 120 are located between the mask 110 and the substrate 130 prior to and during pattern transfer. The spacers 120 provide for and maintain an essentially parallel and proximal separation between the mask 110 and the substrate 130. A deformation of one or more of the mask 110, the spacers 120, and the substrate 130 facilitates the pattern transfer by enabling the mask 110 and the substrate 130 to contact one another. For example, in some embodiments, one or both a flexible mask 110 and a flexible substrate 130 is employed. In another embodiment, a deformable (e.g., collapsible) spacer 120 is employed. In yet other embodiments, a combination of one or more a flexible mask 110, a flexible substrate and a deformable spacer 120 are employed. In embodiments that include the combination, rigidity may be provided by a plate or carrier that supports one or both of the mask 110 and substrate 130 during pattern transfer, as described below. Pattern transfer occurs while the mask 110 and the substrate 130 are in direct contact as a result of the flexure and/or deformation.

In some embodiments, especially wherein flexure of one or both of the mask 110 and the substrate 130 are employed, the flexure may occur between or within a region encompassed or bounded by the spacers 120. For example, the spacers 120 may be located at a periphery of a patterned region of the mask (and/or an area to be patterned of the substrate) and the flexure of the mask 110 and/or the substrate 130 occurs within the periphery.

In some embodiments, for example when a deformable spacer 120 is employed, an essentially non-deformable mask 110 and/or an essentially non-deformable substrate 130 is used. For example, a semi-rigid or rigid mask 110 that is not deformed or not intended to be deformed during pattern transfer may be the non-deformable mask 110. Furthermore, when using the deformable spacer 120, one or more of the spacers 120 may be located within a broader patterned area or region. For example, the substrate 130 may be a wafer having a plurality of individual dice or chips defined thereon. The dice have respective local patterned areas. In this example, deformable spacers 120 may be located in spaces or regions between the local patterned areas of the wafer substrate 130. Spaces or regions between local patterned areas include, but are not limited to, 'streets' or 'saw kerfs' separating the individual dice on the wafer substrate 130.

In some embodiments, the spacers 120 are components separate from either the mask 110 or the substrate 130. In such embodiments, the spacers 120 are generally positioned, placed, or otherwise inserted between the mask 110 and the substrate 130 prior to establishing contact between the mask 110 and substrate 130 for the pattern transfer.

In other embodiments, the spacers 120 are formed as an integral part of one or both of the mask 110 and the substrate 130. For example, the spacers 120 may be fabricated as an integral part of the mask 110 in some embodiments. In other embodiments, the spacers 120 may be fabricated as an integral part of the substrate 130. In yet other embodiments, some of the spacers 120 may be formed as an integral part of one or both of the mask 110 and the substrate 130 while others of the spacers 120 are not integral to either the mask 110 or the substrate 130.

In some embodiments, the spacers 120 that are integral to either the mask 110 or the substrate 130 are formed by depositing or growing a material layer on a respective surface of either the mask 110 or the substrate 130. For example, a silicon dioxide ($SiO_2$) layer may be either grown or deposited on a surface of a silicon (Si) substrate 130. Selective etching of the deposited or grown $SiO_2$ layer may be employed to define the spacers 120, for example, resembling stand-off posts. In some embodiments, a uniform height of each of the stand-off post spacers 120 is established by virtue of a simultaneous growth or deposition of the spacers 120. For example, forming the spacers 120 simultaneously using an evaporative material deposition on the substrate 130 surface will generally result in each of the spacers 120 having essentially identical heights. Alternatively or in addition, post-processing of the grown and/or deposited spacers 120 such as, but not limited to, micro-machining (e.g., chemical-mechanical polishing, etc.) may be employed to further adjust and/or to provide for uniform height. Similar methods may be employed to form the spacers 120 on or as an integral part of the mask 110.

In yet other embodiments, the spacers 120 may be separately fabricated and then affixed to one or both of the mask 110 and the substrate 130 using glue, epoxy or other suitable means for joining. However, whether fabricated as an integral part of, or affixed to, one or both of the mask 110 or the substrate 130, the spacers 120 are so fabricated or affixed prior to performing contact lithography employing the contact lithography apparatus 100.

In some embodiments, the deformable spacer 120 may exhibit one or both of plastic deformation and elastic deformation. For example, in a plastic deformation of the deformable spacer 120, a deforming force may essentially crush or smash the spacer 120. After being crushed or smashed, little or no significant recovery of an original shape of the spacer 120 will result when the deforming force is removed. In another example, the deformable spacer 120 may undergo an elastic deformation in response to the deforming force. During elastic deformation, the spacer 120 may bend or collapse but the spacer 120 will essentially return to its original shape once the force is removed. An elastically deforming spacer 120 may comprise a rubber-like material or spring-like material/structure, for example.

In some embodiments, the deformable spacer 120 provides one or both of passive deformation and active deformation. A passively deformable spacer 120 may exhibit one or both of plastic and elastic deformation. Materials having a spring-like behavior suitable for use as passively deformable spacers 120 that exhibit elastic deformation include various elastomeric materials. In particular, the spacers 120 may comprise an elastomeric material such as, but not limited to, nitrile or natural rubber, silicone rubber, perfluoroelastomer, fluoroelastomer (e.g., fluorosilicone rubber), butyl rubber (e.g., isobutylene or isoprene rubber), chloroprene rubber (e.g., neoprene), ethylene-propylene-diene rubber, polyester, and polystyrene. Non-elastomeric materials that are formed in a manner that facilitates spring-like behavior during passive deformation may be employed as well. Examples of non-elastomeric materials that can be formed into springs for use as the spacers 120 include metals such as, but not limited to, beryllium copper and stainless steel as well as essentially any relatively rigid polymer. In addition, many conventional semiconductor materials may be micro-machined into mechanical spring configurations. Examples of such materials include, but are not limited to, silicon (Si), silicon oxide ($SiO_2$), silicon nitride (SiN), silicon carbide (SiC), gallium arsenide (GaAs), and most other conventional semiconductor materials. Such non-elastomeric materials formed as springs may be used to produce passively deformable spacers 120 that exhibit one or both of plastic and elastic deformation depending on the specific shapes and forces employed.

As with passively deformable spacers 120, the actively deformable spacers 120 may exhibit one or both of plastic deformation and elastic deformation. For example, the actively deformable spacer 120 may comprise a piezoelectric material having a crystal lattice that deforms in response to an applied electric field. The lattice deformation in response to the electric field may be used to provide the deformation of the spacer 120 in such exemplary embodiments instead of or in addition to an applied deforming force. Since the lattice deformation of a piezoelectric material essentially returns to an original shape once the applied electric field (i.e., deforming force) is removed, spacers 120 formed from such piezoelectric materials are considered herein to exhibit essentially elastic deformation.

In another example, the actively deformable spacer 120 may comprise an essentially hollow structure such as, but not limited to, a bladder or tube, that is filled with a fluid (e.g., one or both of a gas and a liquid) such that the spacer 120 resists deformation when filled. To activate deformation, the fluid filling the spacer 120 is removed, evacuated, or allowed to leak therefrom. As such, the spacer 120 essentially resists deformation under the deforming force until being activated by removing the filling fluid. Such a spacer 120 may exhibit either elastic or plastic deformation depending on whether the filling fluid is replaced in the hollow structure, for example. In yet another example, the spacer 120 may comprise a thermally activated material that changes shape and/or resiliency in response to a thermal stimulus. Examples of thermally activated materials include, but are not limited to, materials that melt, soften, or exhibit a glass transition at or above a particular temperature. A spacer 120 comprising such a thermally activated material is activated by heating the material above a melting point, a softening point or a glass transition point, depending on the embodiment. A thermoplastic is an example of such a thermally activated material that would exhibit an essentially plastic deformation as a result of activation by the thermal stimulus.

As discussed above, the deformable spacer 120 may provide a deformation that is essentially reversible (i.e., elastic deformation) or essentially irreversible (i.e., plastic deformation). In some embodiments, the deformable spacer 120 may provide a combination of plastic deformation and elastic deformation, depending on the embodiment. An example of a deformable spacer 120 that provides an essentially reversible or elastic deformation is an elastomeric spacer or a spring-like spacer, as described above, for example. An essentially irreversible or plastically deformable spacer 120 may be provided by a rigid or semi-rigid material wherein the spacer 120 comprising the material is crushed or collapsed by application of a deforming force. For example, the spacer 120 may comprise a porous semi-rigid material such as, but not limited to, polystyrene foam and polyurethane foam. Such porous semi-rigid foams may exhibit an essentially irreversible (i.e., plastic) deformation when a deforming force is applied. In another example, a relatively porous silicon dioxide ($SiO_2$) layer deposited on one or both of the mask 110 and the substrate 130 and formed as the post-like spacers 120 may provide a deformation that is essentially irreversible or plastic. In such embodiments, the post-like spacer 120 irreversibly or plastically deforms when a deforming force is applied that is sufficient to essentially crush the post-like spacer 120. Moreover, in some embodiments, the spacer 120 may comprise a combination of reversible and irreversible characteristics using a combination of materials and passive or active deformation, as described above.

Moreover, one or both of the mask 110 and the substrate 130 may be deformable. Moreover, the deformable mask 110 and/or the deformable substrate 130 may exhibit one or both of plastic or elastic deformation as defined hereinabove. Furthermore, the deformable mask 110 and/or substrate 130 may provide one or both of passive or active deformation as defined hereinabove. In some embodiments, one or both of the mask 110 and substrate 130 may comprise materials described above with respect to the spacer 120 to achieve one or more of elastic, plastic, passive and active deformations.

Figure 2A:
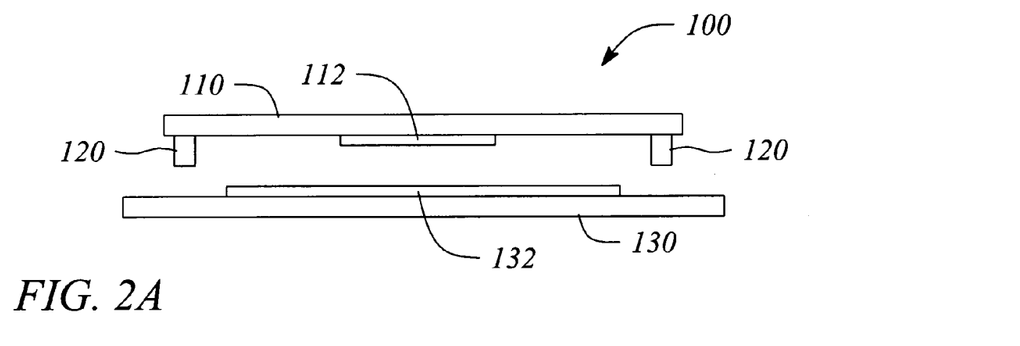
FIG. 2A illustrates a side view of an embodiment of the contact lithography apparatus of FIG. 1 having spacers formed as an integral part of a mask according to an embodiment of the present invention.
Figure 2B:
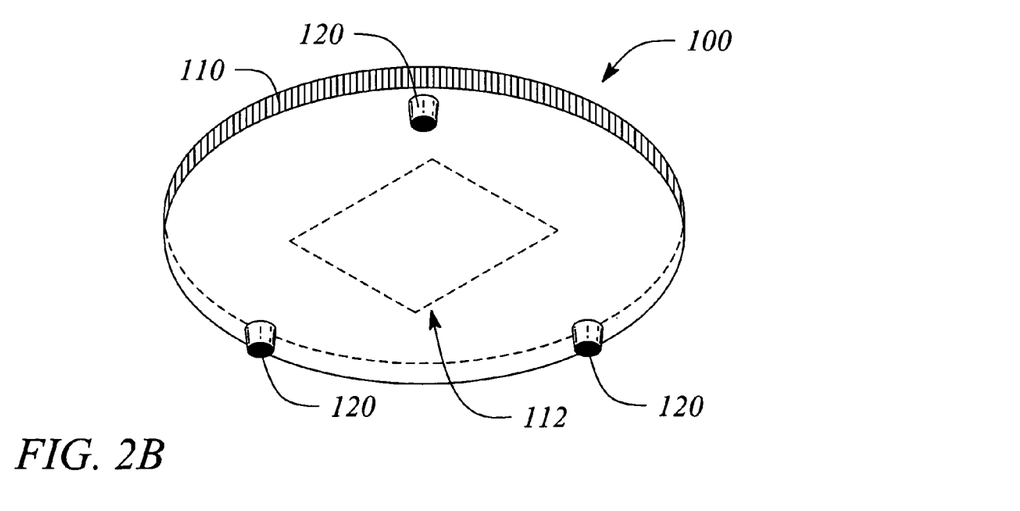
FIG. 2B illustrates a perspective view of the mask illustrated in FIG. 2A according to an embodiment of the present invention.

FIG. 2A illustrates a side view of the contact lithography apparatus 100 of FIG. 1 wherein the spacers 120 are formed as an integral part of the mask 110 according to an embodiment of the present invention. FIG. 2B illustrates a perspective view of the mask illustrated in FIG. 2A according to an embodiment of the present invention. In particular, as illustrated in FIG. 2B, three spacers 120 depicted as stand-off posts or pillars are formed on or in a surface of the mask 110.

Figure 2C:
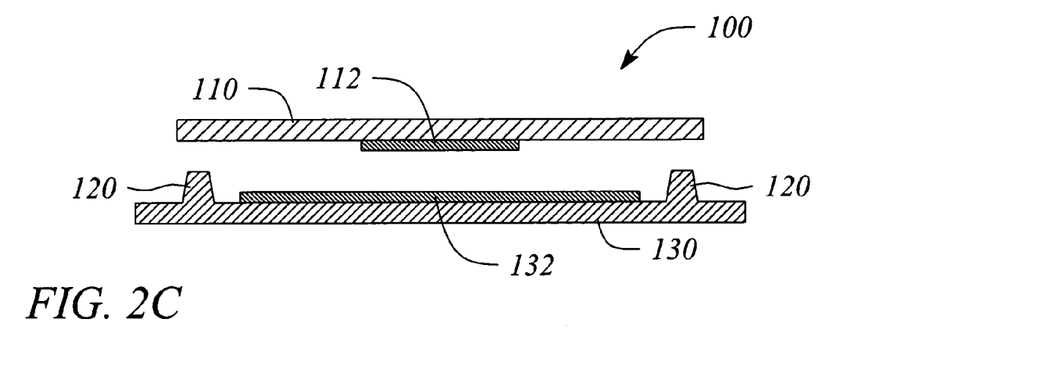
FIG. 2C illustrates a cross section of another embodiment of the contact lithography apparatus of FIG. 1 having spacers formed as an integral part of a substrate according to another embodiment of the present invention.

FIG. 2C illustrates a cross sectional view of the contact lithography apparatus 100 of FIG. 1 wherein the spacers 120 are formed as an integral part of the substrate 130 according to another embodiment of the present invention. For example, the spacers 120 may be fabricated as an integral part of the substrate 130 using conventional semiconductor fabrication techniques including, but not limited to, one or more of etching, deposition, growth, and micromachining.

Whether separately provided or fabricated (i.e., formed) as part of one or both of the mask 110 and the substrate 130, in some embodiments, the spacer 120 comprises a precisely controlled dimension. Specifically, the spacer 120 may be fabricated with a precisely controlled dimension for spacing apart or separating the mask 110 and the substrate 130. As used herein, the term 'spacing dimension' refers to a dimension of the spacer 120 that controls the separation between the mask 110 and the substrate 130 when the spacers 120 are employed in the contact lithography apparatus 100.

For example, a height of each of the three spacers 120 in FIG. 2B may be precisely controlled during fabrication of the spacers 120. As a result, when the spacers 120 act together to separate the mask 110 from the substrate 130, the separation takes on a precisely controlled spacing dimension equal to the height of the spacers 120. Moreover, in the example, if the height of the spacers 120 are all essentially equal to one another, the mask 110 and the substrate 130 are not only separated by the spacers 120 but also are aligned essentially parallel to one another by the separating action of the spacers 120. For example, parallel alignment of the mask 110 and the substrate 130 may be achieved by employing the spacers 120, as illustrated in FIG. 2B with essentially identical heights.

Another embodiment of the spacing dimension is a diameter of the spacer. For example, the diameter of a spacer 120 having a circular cross section may be the spacing dimension. Examples of such a spacer 120 with a circular cross section include, but are not limited to, a rod, an O-ring and a sphere. By controlling the diameter of the spacers 120, a parallel alignment of the mask 110 and the substrate 130 may be achieved when the mask 110 and the substrate 130 are in mutual contact with and separated by the spacers 120 with a circular cross section. In some embodiments, the spacer 120 having a circular cross section has a shape of a ring or loop, such as a circle, semi-circular, rectangle or square, wherein a cross sectional diameter of the ring spacer 120 is uniformly equal about a perimeter of the ring. Such ring-shaped spacer 120 may surround an edge of the mask 110 and the substrate 130, as further described below.

In some embodiments, when employed in the contact lithography apparatus 100, the spacers 120 are located outside of (i.e., peripheral to) a patterned area of the mask 110 and/or an area of the substrate 130 that is to be patterned (i.e., target area or portion). For example, the spacers 120 may be located at or near an edge (i.e., periphery) of one or both of the mask 110 and the substrate 130. In other embodiments, the spacers 120 are located other than at the edge or periphery of the mask 110 or the substrate 130. For example, the spacers may be located between patterned areas (e.g., in saw kerfs between local patterned regions), as described above.

For example, referring again to FIG. 2B, a patterned area 112 of the mask 110 is illustrated as an exemplary rectangular area bounded by a dashed line. The post-shaped spacers 120 illustrated in FIG. 2B are outside of the patterned area 112. Moreover, referring to FIG. 2C, a target portion or area 132 of the substrate 130 is illustrated on the substrate 130 surface. The post-shaped spacers 120 illustrated in FIG. 2C are outside of the target portion 132 of the substrate 130 as well as the patterned area 112 of the mask 110. As used herein, 'target portion' or 'target area' refers to that portion of the substrate 110 that receives a copy of a mask pattern as represented by the patterned area 112 of the mask 110.

In some embodiments, the spacers 120 are positioned to roughly align with corresponding areas on the mask 110 and/or the substrate 130 that have a minimum local relief or otherwise few if any pattern features. Locating the spacers 120 in areas having few if any pattern features, such as beyond a patterned area or area being patterned, reduces interference between the spacers 120 and the patterning being performed using the contact lithography apparatus 100 in some embodiments, while in other embodiments, ensures a minimal interference therebetween.

Herein, 'local relief' refers to a feature height, wherein 'feature' is defined below. In general, the feature height is less than the spacing dimension of the spacer 120 to avoid contact between patterned areas of the mask 110 and the substrate 130 prior to deformation. "Minimum local relief" means any areas of the mask 110 and the substrate 130 that have minimum feature heights. In other words, areas of the mask 110 and/or the substrate 130 exhibiting minimum local relief are areas that contain essentially minimal protrusions (positive or negative) from a nominal planar surface of respectively either the mask 110 or the substrate 130. By positioning the spacer 120 to align with areas of minimum local relief, the spacers 120 are able to slide on a contact surface during alignment without adversely affecting the spacer-provided parallel and proximal relationship of the mask 110 and the substrate 130.

In some embodiments, the spacers 120 provide a spacing dimension (i.e., proximal relationship) in the range of about 0.01 to 50 microns ($\mu m$). In other embodiments, the spacers 120 provide a spacing dimension in a range of 0.1 to 10 microns ($\mu m$). In yet other embodiments, the spacers 120 may provide essentially any spacing dimension that befits a particular contact lithography situation or application.

Figure 2D:
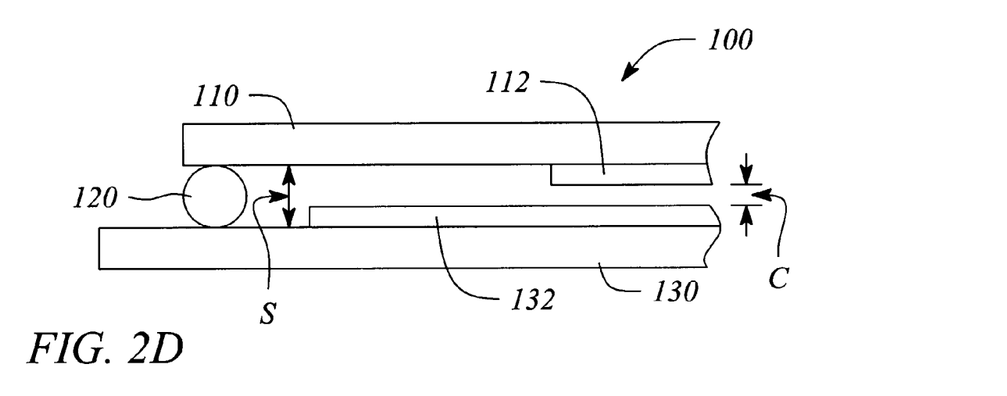
FIG. 2D illustrates a side view of a contact lithography apparatus according to an embodiment of the present invention.

FIG. 2D illustrates a side view of the contact lithography apparatus 100 according to an embodiment of the present invention. In particular, FIG. 2D illustrates the spacers 120 acting to separate the mask 110 from the substrate 130 by the spacing dimension S. The exemplary spacers 120 illustrated in FIG. 2D have a circular cross section, by way of example, and may be provided separately from the mask 110 and the substrate 130 in some embodiments.

In some embodiments, the spacing dimension of the spacers 120 is greater than a maximum combined height of features of the mask 110 and/or the substrate 130. By 'feature' it is meant any protrusion (positive or negative) from a nominal planar surface of either the mask 110 or the substrate 130, excluding the spacers 120. A feature height is an extent to which a feature of either the mask 110 or the substrate 130 extends above or away from the nominal surface thereof. In such embodiments, the spacers 120 produce a separation between a maximum height of all features on the mask 110 and a maximum height of all features on the substrate 130 when employed as intended in the contact lithography apparatus 100. In other words, the spacers 120 provide a clearance between the maximum height features of the mask 110 and the substrate 130. As illustrated in FIG. 2D, the clearance C provided by the spacers 120 essentially insures that a highest feature of the mask 110 clears or is spaced apart from a highest feature of the substrate 130.

Figure 3A:
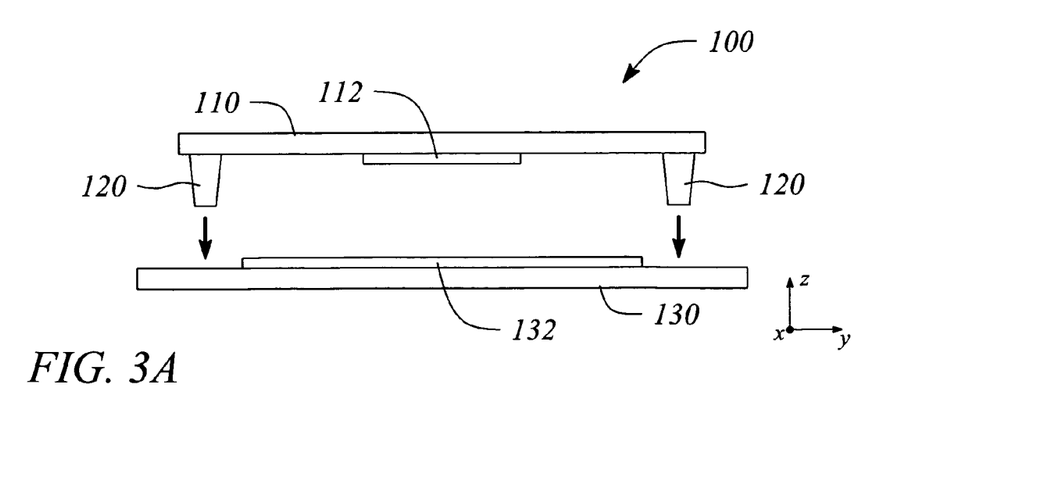
FIG. 3A illustrates a side view of a contact lithography apparatus according to an embodiment of the present invention.

FIG. 3A illustrates a side view of the contact lithography apparatus 100 according to an embodiment of the present invention. In particular, the side view illustrated in FIG. 3A depicts the contact lithography apparatus 100 in an exemplary open or initial configuration prior to initiating pattern transfer. As illustrated in FIG. 3A, the mask 110 and the substrate 130 are oriented in an x-y plane and spaced apart from one another along a z-axis direction of an exemplary Cartesian coordinate system.

Pattern transfer using the contact lithography apparatus 100 is initiated by moving the mask 110 in a z-direction toward the substrate 130, for example. The mask 110 is moved until the spacers 120 contact both of the mask 110 and the substrate 130. A z-axis oriented arrow in FIG. 3A indicates motion of the mask 110 upon pattern transfer initiation. Although not illustrated, the substrate 130 may be moved in a z-direction toward the mask 110, either instead of or in addition to the mask 110 movement, and still be within the scope of the embodiments of the present invention.

Once mutual contact with the spacers 120 is achieved, the spacers 120 provide an essentially parallel separation between the mask 110 and the substrate 130 as described hereinabove. Specifically, the spacers 120 act to maintain a uniform distance and proximal relationship between the mask 110 and the substrate 130 with respect to the vertical or z-axis (z) as a result of the spacing dimension of the spacers 120.

Figure 3B:
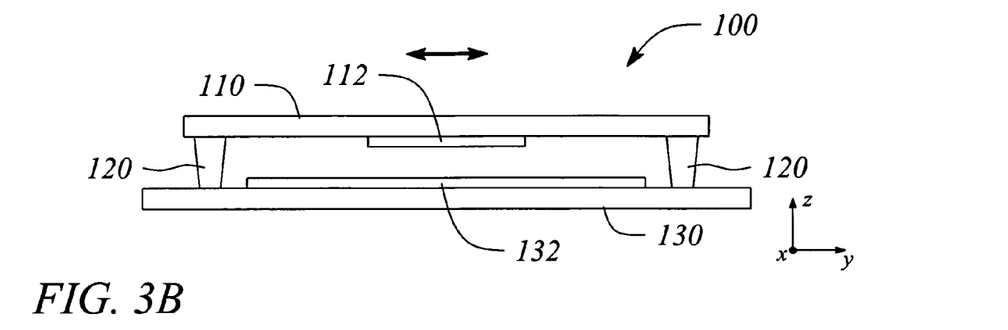
FIG. 3B illustrates a side view of the contact lithography apparatus of FIG. 3A in a closed configuration according to an embodiment of the present invention.

FIG. 3B illustrates a side view of the contact lithography apparatus 100 in a closed configuration according to an embodiment of the present invention. In particular, FIG. 3B illustrates the contact lithography apparatus 100 after initiation of pattern transfer. As illustrated in FIG. 3B, the mask 110 and the substrate 130 are in mutual contact with the spacers 120. The uniform distance between the spaced apart mask 110 and the substrate 130 in the closed configuration is essentially a height (i.e., spacing dimension) of the spacers 120, as illustrated in FIG. 3B.

With the spacers 120 maintaining the parallel separation in the z-direction, one or both of a lateral alignment and an angular alignment (e.g., an x-y alignment and/or a rotational alignment) between the mask 110 and the substrate 130 may be accomplished. In particular, for the exemplary contact lithography apparatus 100 illustrated in FIGS. 3A and 3B, one or both of the mask 110 and the substrate 130 are moved and/or rotated in an x-y plane to accomplish alignment. Mutual contact between the substrate 130, the spacers 120 and the mask 110 is maintained during such alignment. A two-headed arrow depicted in FIG. 3B indicates aligning the mask 110 and the substrate 130 one or both of laterally and angularly.

Since the spacing dimension or height of the spacers 120 establishes the parallel alignment in the z-direction of the mask 110 and the substrate 130, such lateral alignment and/or angular alignment may be accomplished with little or no disturbance to the parallel alignment according to an embodiment of the present invention. As further described hereinabove, in some embodiments, the spacing dimension (e.g., height or cross sectional diameter) of the spacers 120 is sufficient to prevent the patterned area 112 of the mask 110 from contacting or touching the target portion 132 of the substrate 130 during lateral (x-y directions) alignment and/or rotational (ω direction) alignment. In other words, clearance between the respective features of the patterned portion 112 of the mask 110 and the target portion 132 of the substrate 130 is maintained by the height of the spacers 120 during lateral alignment and/or rotational alignment.

In some embodiments, the spacers 120 comprise a material that facilitates lateral alignment between the mask 110 and the substrate 130. In particular, the spacer material is readily slideable on a contacting surface of one or both of the mask 110 and the substrate 130. The slideability of the spacers 120 on the contacting surface or surfaces enables a relative position of the mask 110 and the substrate 130 to be smoothly adjusted in the x-y and/or ω directions.

In some embodiments, the spacers 120 are fabricated from a material that produces a relatively low-friction interface at a contact point between the spacer 120 and one or both of the mask 110 and the substrate 130. The low-friction interface facilitates sliding of the spacer 120 on a surface of one or both of the mask 110 and the substrate 130 at the contact point during alignment. In some embodiments, one or both of the mask 110 and the substrate 130 or contacting portions thereof are fabricated from respective low-friction producing materials, either in lieu of or in addition to the spacers 120, depending on the embodiment. In other embodiments, a contacting surface of the spacer 120 is coated with a material that yields the low-friction interface. In other embodiments, a surface portion of one or both of the mask 110 and the substrate 130, which is contacted by the spacer 120, is coated with a respective material that yields the low-friction interface. In yet other embodiments, both a contacting surface of the spacer 120 and the contacted surface of one or both of the mask 110 and the substrate 130 are so coated with a respective low-friction producing material to facilitate slidability of the spacers 120 during alignment.

Examples of applied coating materials that may provide a low-friction interface include, but are not limited to, Teflon®, a self-assembled monolayer of a fluorinated molecule, graphite, various non-reactive metals, and various combinations of silicon, silicon dioxide, and silicon nitride. Additionally, certain lithographic resist materials including, but not limited to, nano-imprint lithography (NIL) resists, may act as a lubricant to produce the low-friction interface. Yet other exemplary applied coating materials that may provide the low-friction interface include various lubricants including, but not limited to, liquid lubricants (e.g., oils) and dry lubricants (e.g., graphite power) that may be applied to one or more of the contacting or contacted surfaces.

Pattern transfer using the contact lithography apparatus 100 is completed by bringing the patterned area 112 of the mask 110 in contact with the target portion 132 of the substrate 130. As mentioned hereinabove, in some embodiments, the contact is provided by one or both of a flexure of the mask 110 and a flexure of the substrate 130. In other embodiments, the contact is provided by a deformation (reversible or elastic, irreversible or plastic, or a combination thereof) of the spacers 120. Such a deformable spacer 120 might be constructed of one or both of a 'passive' deformable material (e.g., rubber, polymer or another elastomeric material) and an 'active' deformable material (e.g., piezoelectric actuated spacer or a thermally actuated spacer), for example, as described above. Moreover, the deformation of the spacer 120 may be controlled, in some embodiments, such as in an active deformation embodiment.

Figure 3C:
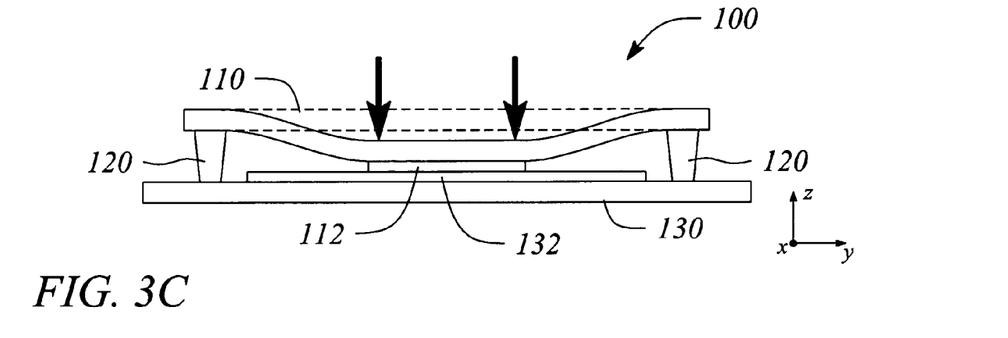
FIG. 3C illustrates a side view of an embodiment of the contact lithography apparatus of FIGS. 3A and 3B in which mask flexure is employed according to an embodiment of the present invention.

FIG. 3C illustrates a side view of the contact lithography apparatus 100 of FIGS. 3A and 3B in which flexure of the mask 110 is employed according to an embodiment of the present invention. The employed flexure is sufficient to bring the mask 110 into contact with the substrate 130. In particular, the flexure of the mask 110 induces a deflection of the mask 110 sufficient to bring the patterned area 112 of the mask 110 in physical contact with the target portion 132 of the substrate 130.

Figure 3D:
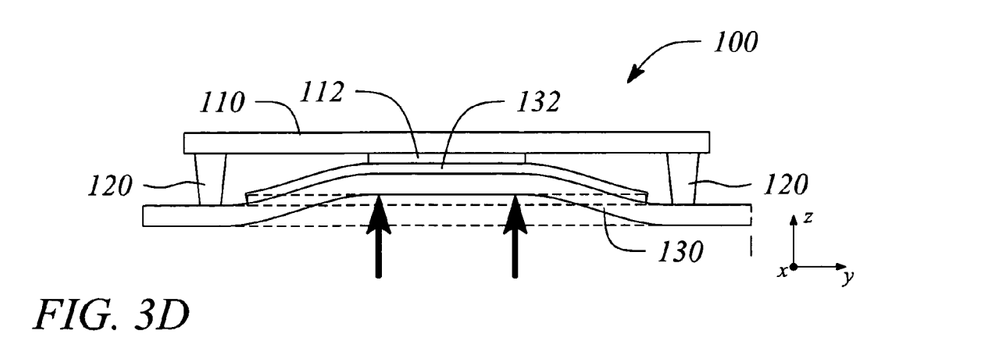
FIG. 3D illustrates a side view of another embodiment of the contact lithography apparatus of FIGS. 3A and 3B in which substrate flexure is employed according to an embodiment of the present invention.

FIG. 3D illustrates a side view of the contact lithography apparatus 100 of FIGS. 3A and 3B in which flexure of the substrate 130 is employed according to an embodiment of the present invention. The substrate flexure serves an equivalent purpose to that of the mask flexure illustrated in FIG. 3C.

For example, when performing ultraviolet (UV)-based NIL, generally one or both of the mask 110 and the substrate 130 are UV transparent. Materials suitable for producing a UV transparent mask 110 include, but are not limited to, glass, quartz, silicone carbide (SiC), synthesized diamond, silicon nitride (SiN), Mylar®, Kapton®, other UV-transparent plastic films as well as any of these materials having additional thin films deposited thereon. Mylar® and Kapton® are register trademarks of E. I. Du Pont De Nemours and Company, Wilmington, Del. When the mask is UV transparent, the substrate 130 need not be transparent. Thus, the substrate 130 material may include silicon (Si), gallium arsenide (GaAs), aggregates of aluminum (Al), gallium (Ga), arsenic (As), and phosphorous (P) (e.g., $Al_xGa_{1-x}As_yP_{1-y}$) as well as various metals, plastics, and glasses. A similar but reversed set of materials may be employed in situations wherein the substrate 130 is transparent and the mask 110 is not transparent. However, it is within the scope of the various embodiments of the present invention for both of the mask 110 and the substrate 130 to be transparent.

In an exemplary embodiment, a gap or clearance between the mask 110 and the substrate 130 (i.e., spacer 120 spacing dimension) is approximately less than or equal to about 5 micrometers (μm), when in the closed configuration before deformation. In this exemplary embodiment, the imprint target area 132 is a square region on the substrate 130 of approximately 2.5 centimeters (cm) in extent. The spacers 120 are each located approximately 1.25 cm from an edge of the target area 132. In such an exemplary embodiment, strain calculations indicate a lateral distortion of less than 1 nanometer (nm) in the imprinted pattern may be realized.

In some embodiments, a force is applied to one or both of the mask 110 and the substrate 130 such that bending or flexing occurs in a region of one or both of the mask 110 and the substrate 130 that is delimited by the spacers 120. In other embodiments, the applied force induces a deformation of the spacers 120 such that the region(s) delimited by the spacers 120 make physical contact. In yet other embodiments, both the spacers 120 and one or both of the mask 110 and the substrate 130 are deformed and/or flexed by the applied force.

The applied force may include, but is not limited to, a hydrostatic force, a mechanical force (e.g., piezoelectrically actuated), an electromagnetic force (e.g., static and/or dynamic electric and/or magnetic force), and an acoustic force (e.g., acoustic wave and/or acoustic shock). The applied force in FIGS. 3C and 3D is indicated by large arrows oriented in a z-direction. The deformation of one or more of the mask 110, the substrate 130, and the spacer 120 is sufficient to facilitate a desired contact pressure between the patterned area 112 and the target portion 132 of the mask 110 and the substrate 130, respectively. For example, in imprint lithography, the contact pressure is sufficient to press the mask or mold 110 into a receiving surface of the substrate 130.

The force is applied after the alignment of the mask 110 and the substrate 130 is accomplished. For example, the mask 110 is moved by sliding on the spacers 120 until aligned with the substrate 130. The force is then applied to bend or flex the mask 110 and/or the substrate 130. As such, contact is achieved without disturbing the alignment. In other examples, the substrate 130 is moved instead of the mask 110, or both the substrate 130 and the mask 110 are moved relative to each other, by sliding on the spacers 120 until aligned. Moreover, in these other examples, the force may be applied to deform the spacers 120 instead of or in addition to the mask 110 and/or the substrate 130. As discussed hereinabove, the deformation may be one or more of plastic, elastic, passive or active.

In some embodiments, the flexure force may be applied by mechanical means. For example, a clamp may be used to press one or more of the mask 110, the substrate 130 and the spacer 120, thereby inducing deformation and contact between the mask 100 and the substrate 130. In other embodiments, an articulated armature may be employed to impart the flexure force. In yet other embodiments, hydrostatic pressure may be applied to produce the flexure.

Hydrostatic pressure may be applied using a hydraulic press or by way of a hydraulic bladder, for example. Alternatively, hydraulic pressure may be applied using an air pressure difference between a cavity between the mask 110 and the substrate 130 and a region surrounding the contact lithography apparatus 100. Examples of using the air pressure difference are described in co-pending patent application by Wu et al., U.S. Ser. No. 10/931,672, filed Sep. 1, 2004, incorporated herein by reference.

In some embodiments, the spacers 120 may remain intact during the flexure of one or both of the mask 110 and the substrate 130. In other embodiments, the spacers 120 may collapse or otherwise deform to a varying degree during or as a result of the application of the force that causes flexure. In such embodiments, the collapse of the spacers 120 may occur after a substantial portion of the flexure has taken place to minimize any alignment drift and/or slip that may occur during the collapse. In some of such embodiments, the spacers 120 may be made of a material that recovers or regains an initial shape or dimension after the flexure, and therefore, may be reusable (e.g., reversible or elastic deformation). For the purposes of the various embodiments, the spacer 120 may be selected from a material or a combination of materials that are one or more of rigid, semi-rigid, resilient, elastically deformable, plastically deformable, passively deformable, actively deformable, disposable and reusable, as has been described hereinabove.

Figure 3E:
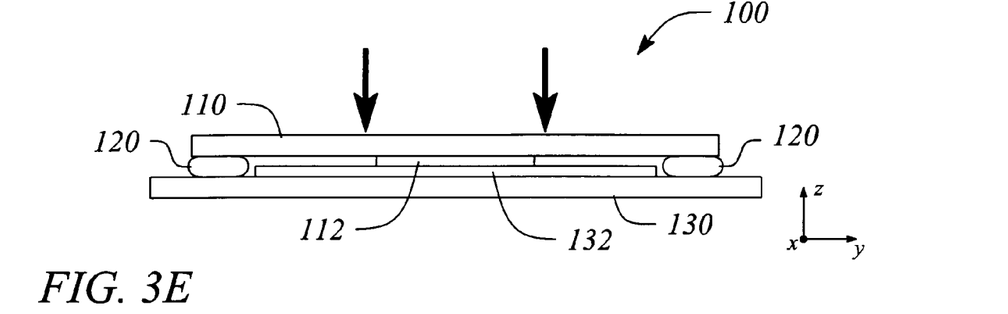
FIG. 3E illustrates a side view of an embodiment of the contact lithography apparatus of FIGS. 3A and 3B in which spacer deformation is employed according to an embodiment of the present invention.

FIG. 3E illustrates a side view of an embodiment of the contact lithography apparatus 100 of FIGS. 3A and 3B in which deformation of the spacer 120 is employed according to an embodiment of the present invention. As illustrated in FIG. 3E, the applied force (arrows) acting through the mask induces a deformation of the spacers 120 to allow the patterned area 112 of the mask 110 to contact and press against the target portion 132 of the substrate 130 with the desired contact pressure.

Figure 3F:
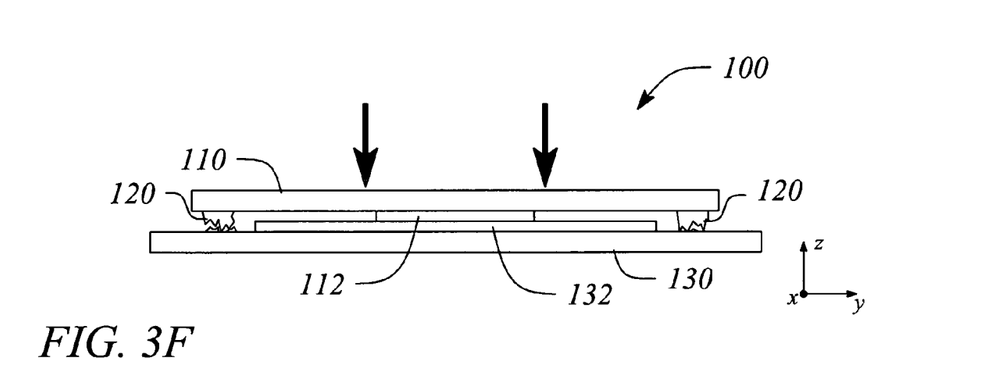
FIG. 3F illustrates a side view of an embodiment of the contact lithography apparatus of FIGS. 3A and 3B in which a spacer exhibiting plastic deformation is employed according to an embodiment of the present invention.

FIG. 3F illustrates a side view of an embodiment of the contact lithography apparatus of FIGS. 3A and 3B in which a plastic or irreversible deformation of the spacer 120 is employed according to an embodiment of the present invention. As illustrated in FIG. 3F, the applied force (arrows) acting through the mask 110 induces a plastic or facture-based deformation of the spacers 120 to allow the patterned area 112 of the mask 110 to contact and press against the target portion 132 the substrate 130 with the desired contact pressure.

Figure 3G:
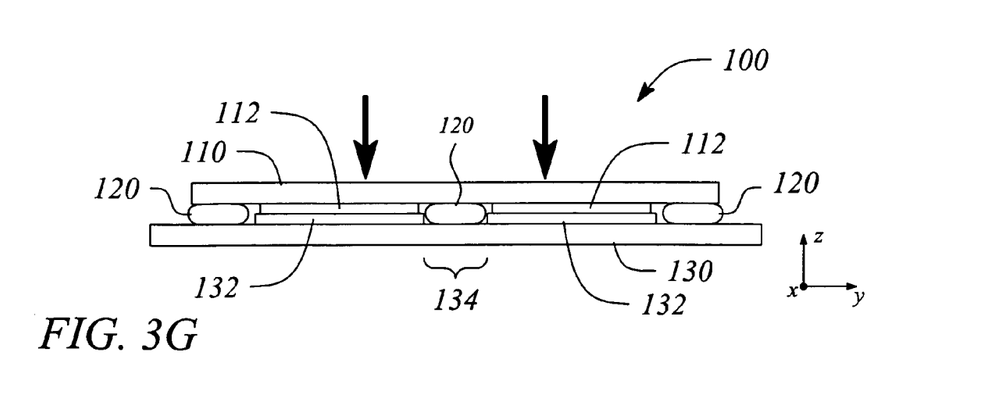
FIG. 3G illustrates a side view of an embodiment of the contact lithography apparatus of FIGS. 3A and 3B in which deformable spacers are employed according to an embodiment of the present invention.

FIG. 3G illustrates a side view of an embodiment of the contact lithography apparatus 100 in which deformable spacers 120 are employed according to an embodiment of the present invention. In FIG. 3G, a plurality of deformable spacers 120 are located within a broader patterned area or region including, but not limited to spaces or regions 134 (e.g., streets, saw kerfs, etc.) between multiple local patterned areas 112 of the mask 110 and/or of the target portions 132 of the substrate 130. As illustrated in FIG. 3G, the applied force (arrows) acting through the mask 110 induces a deformation of the spacers 120 to allow the patterned areas 112 of the mask 110 to contact and press against the target portions 132 of the substrate 130 with the desired contact pressure.

While the applied force is illustrated in FIGS. 3E, 3F and 3G generally applied to the mask 110, the force may be applied to the substrate 130 in lieu of or in addition to the mask 110 and still be within the scope of the various embodiments of the present invention. Moreover, while the applied force is illustrated in FIGS. 3E-3G generally as centrally located arrows adjacent to the mask 110, it is within the scope of the embodiments described herein for the force to be applied anywhere along the surface of the mask 110 and/or the substrate 130, such that deformation of the spacers 120 is induced.

Figure 4:
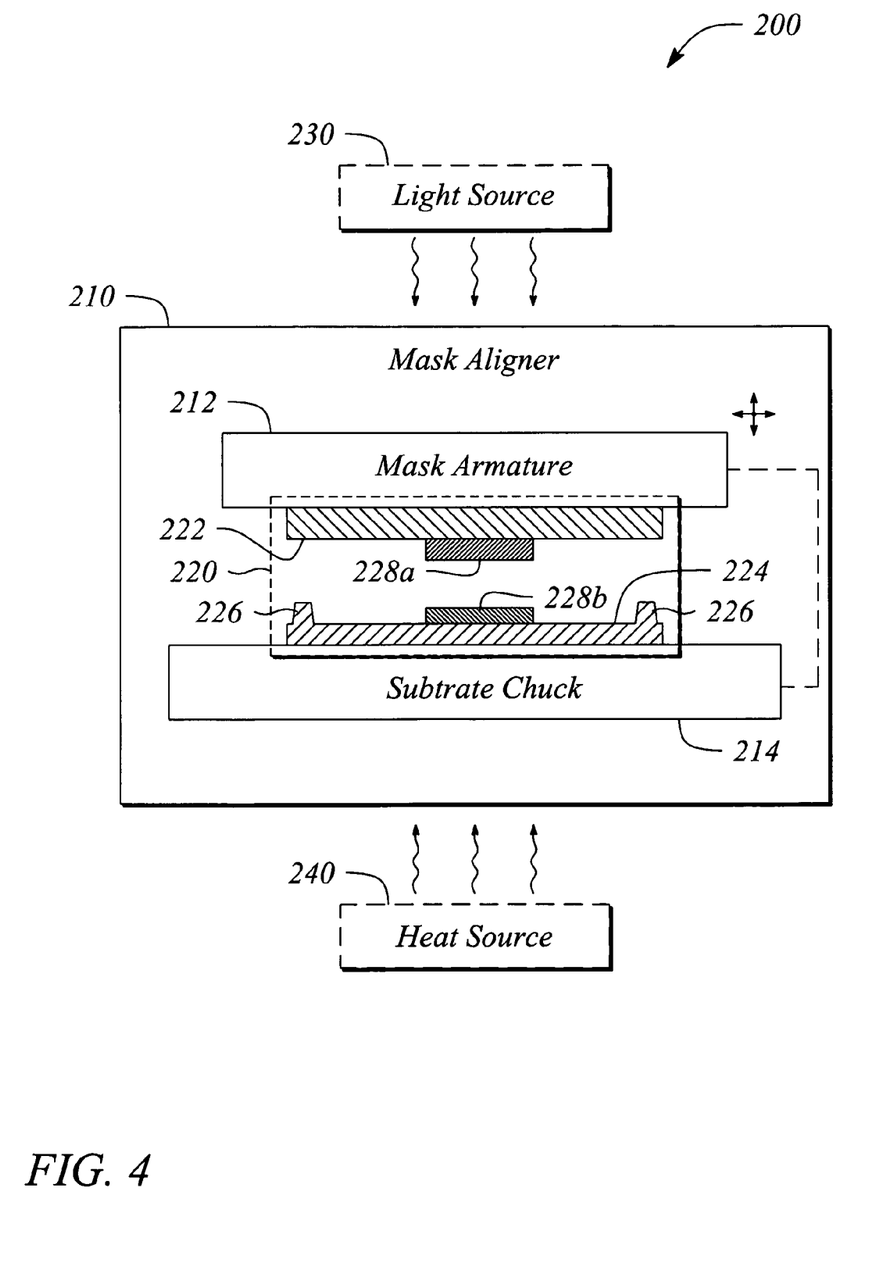
FIG. 4 illustrates a block diagram of a contact lithography system according to an embodiment of the present invention.

FIG. 4 illustrates a block diagram of a contact lithography system 200 according to an embodiment of the present invention. In particular, the contact lithography system 200 provides for a parallel alignment, a lateral alignment and a rotational alignment between a patterning tool (e.g., photolithographic mask, imprint lithography mold, lithographic template) and a substrate to be patterned. Furthermore, the contact lithography system 200 facilitates patterning the substrate by direct contact between the patterning tool and the substrate. The facilitated patterning is accomplished through a flexure of one or more of the patterning tool, the substrate and a spacer that is between the patterning tool and the substrate, without substantially disturbing the alignment thereof. The contact lithography system 200 is applicable to any lithography methodology that involves contact between the patterning tool and the substrate being patterned including, but not limited to, photographic contact lithography, X-ray contact lithography, and imprint lithography. Hereinafter, the patterning tool is referred to as a mask for simplicity of discussion and without loss of generality.

The contact lithography system 200 comprises a contact mask aligner 210 and a contact lithography module or apparatus 220. The contact mask aligner 210 holds the contact lithography module 220 during both lateral/rotational alignments and patterning. The contact mask aligner 210 comprises a mask armature 212 and a substrate chuck, platen, or stage 214. In some embodiments, the contact mask aligner 210 may include parts of a conventional mask aligner with a substrate chuck or stage for holding a substrate and a mask armature for holding a mask. In the conventional contact mask aligner, the mask armature and the substrate chuck are movable relative to one another to enable relative lateral and rotational alignments (e.g., x-y alignment and/or angular (ω) alignment) of a mask and/or a mask blank that incorporates or holds the mask and a substrate. The contact mask aligner 210 of the present invention differs from the conventional mask aligner in that the mask aligner 210 holds or supports the contact lithography module 220 of the present invention for substrate patterning, which is further described below. In addition, a relative motion between the mask armature and the substrate chuck that is conventionally employed to achieve a pattern-transferring contact between the mask and the substrate is also employed in various embodiments of the present invention. However, such conventional relative motion is employed in the embodiments of the present invention to close the contact lithography module 220, but not for pattern transfer. Instead, a deformation in the lithography module 220 is employed to provide a pattern-transferring contact in the closed contact lithography module 220 while the mask aligner 210 maintains alignment.

The contact lithography module 220 comprises a mask blank 222, a substrate carrier 224, and one or more spacers 226. In some embodiments, the mask blank 222 comprises a flexible plate that provides a mounting surface for a patterning tool or 'mask' 228a. In some of such embodiments, the mask 228a may be either flexible, semi-rigid or essentially rigid (i.e., essentially non-deformable). In such embodiments, the mask 228a may be removably affixed to the mounting surface of the mask blank 222 using an adhesive or a means for mechanical fastening, for example, such as clamps or clips, or using a vacuum. In other embodiments, the mask blank 222 is a rigid plate or a semi-rigid plate and the mask 228a is flexible. In such embodiments, the mask 228a is removably affixed to a mounting surface of the mask blank 222 in a manner that facilitates flexing of the flexible mask 228a. In yet other embodiments, the mask 228a may be formed in or is fabricated as part of the mask blank 222. In such embodiments, the mask blank 222 may be considered essentially equivalent to the mask 228a. The flexibility of the mask blank 222 and/or the mask 228a is employed to facilitate the pattern-transferring contact in some embodiments, as described further below.

In some embodiments, the substrate carrier 224 is a rigid or semi-rigid plate that provides a mounting surface for a substrate 228b. The substrate 228b is removably affixed to the mounting surface of the substrate carrier 224. For example, an adhesive or a mechanical fastener may be employed to affix the substrate 228b to the substrate carrier 224. In another example, a vacuum, electromagnetic, or similar force known in the art may be employed to affix the substrate 228b to the carrier 224.

In some embodiments, the substrate 228b is flexible and may be affixed to the mounting surface in a manner that facilitates flexing. For example, the substrate 228b may be affixed only around a perimeter of the substrate 228b. Alternatively, the substrate 228b may be affixed only until flexing is needed. For example, a vacuum holding the substrate 228b may be released or turned off to facilitate flexing.

In other embodiments, the substrate carrier 224 comprises a flexible plate to which the substrate is removably affixed. In such embodiments, the substrate 228b may be flexible, semi-rigid or essentially rigid (i.e., essentially non-deformable). In yet other embodiments, the substrate 228b itself may act as the substrate carrier 224. In any case, the flexibility of the substrate carrier 224 (when present) and/or the substrate 228b is employed to facilitate the pattern-transferring contact in some embodiments.

In some embodiments, the spacers 226 are positioned between the mask blank 222 and the substrate carrier 224 outside of an area of the mask 228a and the substrate 228b. In other embodiments, the spacers 226 are positioned within an area of the mask 228a and the substrate 228b (not illustrated for the system 200). The spacers 226 are all of essentially uniform vertical spacing dimension (e.g., height or diameter) such that when the mask blank 222 and the substrate carrier 224 are brought in contact with the spacers 226, the mask blank 222 is spaced apart from and aligned (i.e., oriented) essentially parallel with the substrate carrier 224. Moreover, in the embodiments further including one or both of the mask 228a and the substrate 228b, the mask 228a and the substrate 228b are aligned (i.e., oriented) essentially parallel to one another in a spaced apart relationship by virtue of being affixed to the mask blank 222 and the substrate carrier 224, respectively. In some embodiments, the spacers 226 are separately provided elements. In other embodiments, the spacers 226 are affixed to one or both of the mask blank 222 and the substrate carrier 224. In still other embodiments, the spacers 226 are fabricated as integral parts of one or both of the mask blank 222 and the substrate carrier 224.

In some embodiments, the spacers 226 are positioned between the mask 228a and the substrate 228b rather than between the mask blank 222 and the substrate carrier 224. Again, the spacers 226 are of uniform vertical spacing dimension (e.g., height or diameter) such that when the mask 228a and the substrate 228b are brought in contact with the spacers 226, the mask 228a is spaced apart from and aligned essentially parallel and proximal with the substrate 228b. In these embodiments, the spacers 226 are located outside of a patterning area of the mask 228a and a target portion of the substrate 228b. In some of these embodiments, the spacers 226 are separately provided elements. In other embodiments, the spacers 226 are either affixed to one or both of the mask 228a and the substrate 228b or fabricated as integral parts of one or both of the mask 228a and the substrate 228b.

In some embodiments, the contact lithography module 220 is essentially similar to the contact lithography apparatus 100 described hereinabove. In such embodiments, the mask blank 222 and the mask 228a together are essentially similar to the mask 110, while the substrate carrier 224 and the substrate 228b are essentially similar to the substrate 130, and the spacers 226 are essentially similar to the spacers 120 described herein above with respect to the various embodiments of the contact lithography apparatus 100.

The contact mask aligner 210 initially holds the contact lithography module 220 as two separated or spaced-apart sections dictated by the relative positions of the mask armature 212 and substrate chuck 214. In particular, the mask blank 222 and the affixed mask 228a are held by the mask armature 212 of the mask aligner 210 while the substrate carrier 224 and the affixed substrate 228b are seated in and held by the substrate chuck 214. As described above, the spacers 226 may be affixed to either the mask blank 222, the mask 228a, the substrate carrier 224, the substrate 228b, or any combination thereof, in some embodiments. In other embodiments, the spacers 226 may be fabricated as an integral part of either the mask blank 222, the mask 228a, the substrate carrier 224, the substrate 228b, or any combination thereof. Alternatively, the spacers 226 may be merely positioned therebetween. Moreover, some of the spacers 226 may be merely positioned therebetween, while others of the spacers 226 are one or both of affixed to and fabricated integrally with one or more of the mask blank 222, the mask 228a, the substrate carrier 224, the substrate 228b, or any combination thereof. When held by the mask aligner 210 as spaced apart sections, the contact lithography module 220 is said to be 'open'.

Figure 5A:
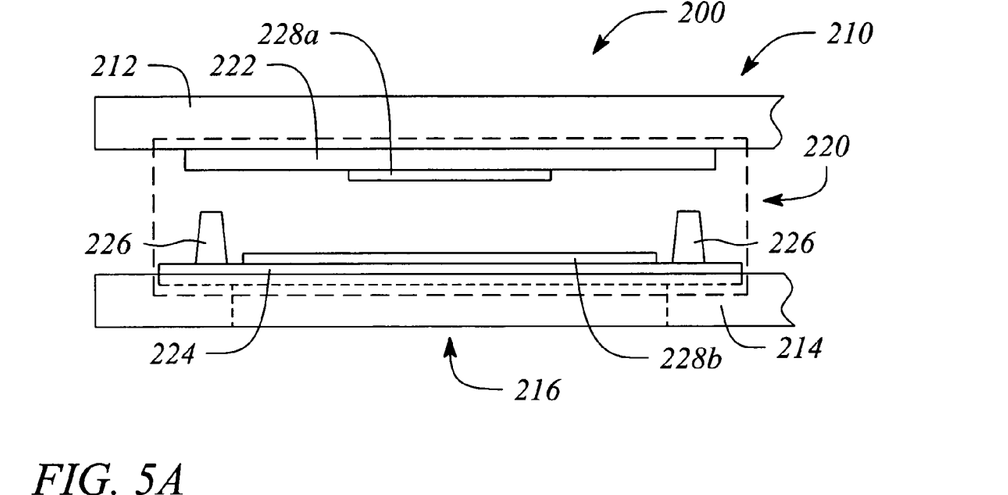
FIG. 5A illustrates a side view of a mask aligner portion of the contact lithography system of FIG. 4 in an initial, open configuration according to an embodiment of the present invention.

FIG. 5A illustrates a side view of a mask aligner 210 portion of the contact lithography system 200 in an initial, open configuration according to an embodiment of the present invention. As illustrated in FIG. 5A, the spacers 226 are conical-shaped in this embodiment and adjacent to or on the substrate carrier 224, by way of example. A dashed line essentially encloses the illustrated elements of the lithography module 220 in FIG. 5A. Additionally, only the portion of the mask aligner 210 in a vicinity of the lithography module 220 is illustrated in FIG. 5A.

Figure 5B:
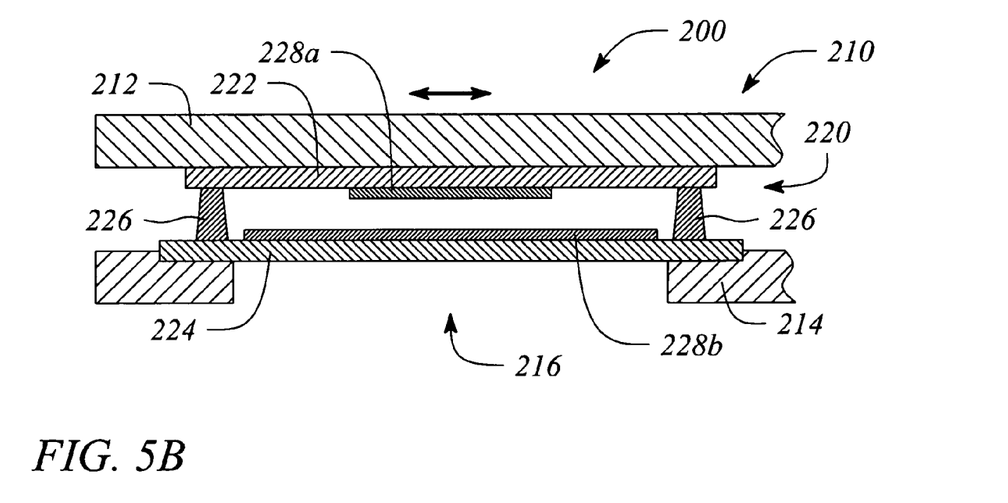
FIG. 5B illustrates a cross sectional view of the mask aligner portion of the contact lithography system of FIG. 5A with a contact lithography module in a closed configuration according to an embodiment of the present invention.

FIG. 5B illustrates a cross sectional view of the mask aligner 210 portion of the contact lithography system 200 of FIG. 5A with the contact lithography module 220 in a closed configuration according to an embodiment of the present invention. In some embodiments, the closed configuration is achieved by moving the mask armature 212 and the substrate chuck 214 toward one another to bring the mask blank 222 and substrate carrier 224 in mutual contact with the spacers 226. The movement of the mask armature 212 and the sample chuck 214 may comprise moving one or both of the armature 212 and the chuck 214 relative to a reference frame of the mask aligner 210. Such movement is consistent with conventional operation of a mask aligner that brings an aligned mask in contact with a resist covered substrate. In the closed configuration of the contact lithography module 220, the mask 228a is separated from the substrate 228b, such that there is clearance or a space between one or both of a feature extending from the mask 228a in a direction toward the substrate 228b and a feature extending from the substrate 228b toward the mask 228a when closed.

The closed configuration of the contact lithography module 220 facilitates alignment of the mask 228a and the substrate 228b using a conventional operation of the mask aligner 210 in a way similar to mask alignment known in the art. Specifically, alignment (i.e., lateral alignment and rotational alignment) is provided by a relative motion (e.g., x-y motion and angular motion) of the mask blank 222 and/or the substrate carrier 224. However, unlike the conventional mask aligner operation, the relative motion is provided by sliding one or both of the mask blank 222 and substrate carrier 224 on a slideable contact between the spacers 226 and a surface of one or both of the mask blank 222 and/or the substrate carrier 224 that may include a surface of the mask 228a and/or the substrate 228b, depending on the embodiment. Moreover, unlike the conventional mask aligner operation, the relative motion is provided by a low-friction interface or 'slideable contact' (i.e., the interface being smooth and/or slideable) between the spacers 226 and the respective surface(s). Moreover, the mask blank 222 and the substrate carrier 224 are held essentially parallel to one another by the separating action of the spacers 226. Sliding on the slideable contact maintains the essentially parallel relationship between the mask blank 222 and the substrate carrier 224 throughout and following the alignment. A double-headed arrow illustrated in FIG. 5B indicates the relative motion (e.g., x-y motion and angular motion) of the mask blank 222 and/or the substrate carrier 224 during alignment.

Once aligned, contact is provided between the mask 228a and substrate 228b by deformation of one or more of the mask blank 222, the substrate carrier 224, the mask 228a, the substrate 228b, and the spacers 226. In some embodiments, deformation is provided by a force applied to an appropriate flexible element or elements of the contact lithography module 220, as dictated by a specific embodiment. For example, when the mask blank 222 is the flexible element, the force is applied to flex the mask blank 222 about the spacers (similar to that illustrated in FIG. 3C, for example). In another example, when the substrate 228b is the flexible element, the force is applied to the substrate 228b (similar to that illustrated in FIG. 3D or 5C, for example). In yet another example, the force is applied to one or both of an essentially non-flexible mask 228a and an essentially non-flexible substrate 228b to deform the deformable spacers 226 (similar to that illustrated in FIGS. 3E, 3F and 5D, for example). In any event, application of the force induces deformation of the respective deformable element and facilitates contact between the mask 228a and the substrate 228b for pattern transfer.

Figure 5C:
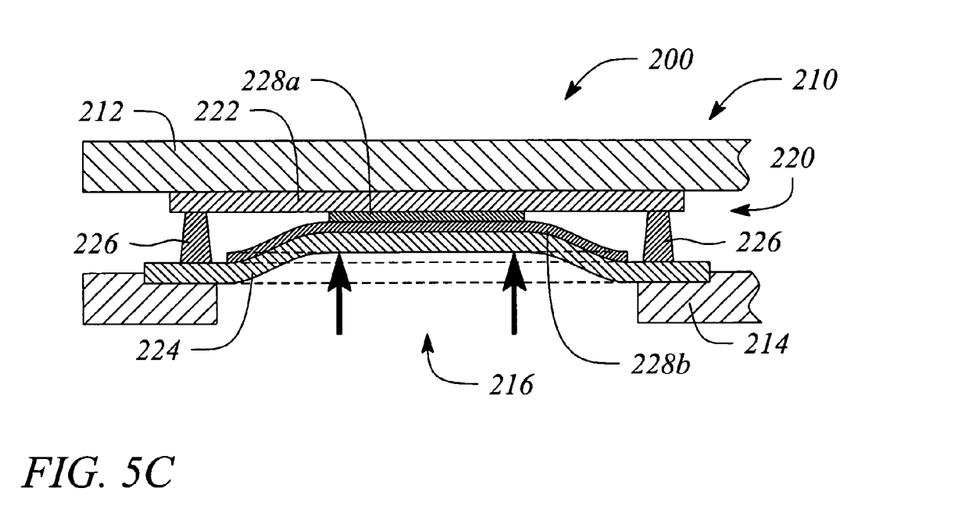
FIG. 5C illustrates a cross sectional view of mask aligner portion of the contact lithography system of FIG. 5B depicting force being applied to induce flexure of a flexible substrate carrier according to an embodiment of the present invention.

FIG. 5C illustrates a cross section view of the mask aligner 210 portion of the contact lithography system 200 depicting force being applied to induce flexure of a flexible substrate carrier 224 according to an embodiment of the present invention. The induced deformation facilitates a physical contact between the mask 228a and substrate 228b, as illustrated in FIG. 5C. The force may be applied as described hereinabove with respect to the contact lithography apparatus 100. For example, the flexure may be induced by an application of a hydrostatic pressure through an opening 216 in the substrate chuck 214.

FIG. 5C further illustrates that the substrate 228b also flexes with the flexure of the substrate carrier 224 according to an embodiment. However, it is within the scope of the embodiments of the present invention that the substrate 228b may be sized or shaped such that flexure of the substrate 228b is not concomitant with the flexure of the substrate carrier 224. Moreover, it is within the scope of the various embodiments of the present invention that the substrate carrier 224 also has an opening similar to the opening 216 in the substrate chuck 214, such that flexure may be limited to flexing the substrate 228b only. Similarly, in some embodiments, flexure of the mask blank 222 may or may not include flexure of the mask 228a or alternatively, an opening in the mask blank 222 may allow for flexure of the mask 228a toward the substrate 228b without also flexing the mask blank 222, depending on the embodiment. Therefore, the embodiment illustrated in FIG. 5C is exemplary only and not a limitation herein.

In some embodiments, the mask blank 222 and the mask 228a are essentially transparent to light or X-ray to facilitate exposing a photoresist layer on the substrate 228b through the mask 228a as in photolithography, for example. Alternatively, the mask blank 222 has an opening while the mask 228a is transparent. In some embodiments, the substrate carrier 224 and the substrate 228b are essentially transparent to light or X-ray. Alternatively, the substrate carrier 224 has an opening while the substrate 228b is transparent. In other embodiments, one or both of the mask blank 222 and the substrate carrier 224 are essentially transparent to light or have an opening to facilitate photo-curing or to facilitate photo-softening of a moldable layer on a surface of the substrate 228b as in imprint lithography, for example. In such embodiments, the contact lithography system 200 further comprises an irradiative source 230 (e.g., infrared, visible, and/or ultraviolet (UV) light or alternatively an X-ray source). FIG. 4 illustrates an optional irradiative source 230 by way of example.

In other embodiments, the moldable layer on the substrate 228b is cured using heat or softened using heat followed by cooling. In such embodiments, the contact lithography system 200 further comprises a heat source 240 that applies heat for the moldable layer during imprinting, also illustrated in FIG. 4 as an option by way of example. In some embodiments, the contact lithography system 200 comprises both an irradiative source 230 and a heat source 240 enabling one or both of heat curing/softening and photo-curing/softening of the moldable layer, during imprint lithography and photo-exposure during photolithography. Thus, in some embodiments, the contact lithography system 200 is essentially a turn-key system that provides alignment, contact lithography (e.g., one or both of photo- and imprint lithography) using deformation, as described above, and curing of a receiving layer in a single setup. Further, a controllable contact pressure, facilitated by the elements of the contact lithography module 220 embodiments, provides uniform pattern transfer.

Figure 5D:
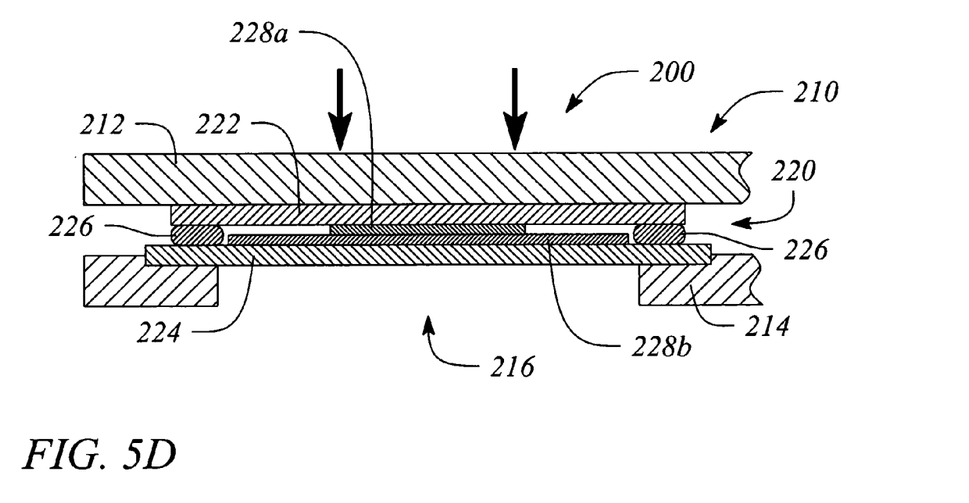
FIG. 5D illustrates a cross sectional view of mask aligner portion of the contact lithography system of FIG. 5B depicting force being applied to induce spacer deformation between a mask and a substrate carrier according to an embodiment of the present invention.

FIG. 5D illustrates a cross sectional view of mask aligner portion 210 of the contact lithography system 200 of FIG. 5B depicting force being applied to induce a deformation of a deformable spacer 226 between a mask blank 222 and a substrate carrier 224 according to an embodiment of the present invention. In some embodiments, the mask blank 222 and the substrate carrier 224 are independently flexible, semi-rigid or rigid. In some embodiments, the mask 228a and the substrate 228b are independently flexible, semi-rigid or rigid. In each embodiment, the mask armature 212 and the sample chuck 214 are essentially non-deformable such that only the spacers 226 deform. In each instance of the contact lithography system 200 described hereinabove, the flexible element or elements may be independently one or more of plastically, elastically, passively and actively deformable.

Figure 6:
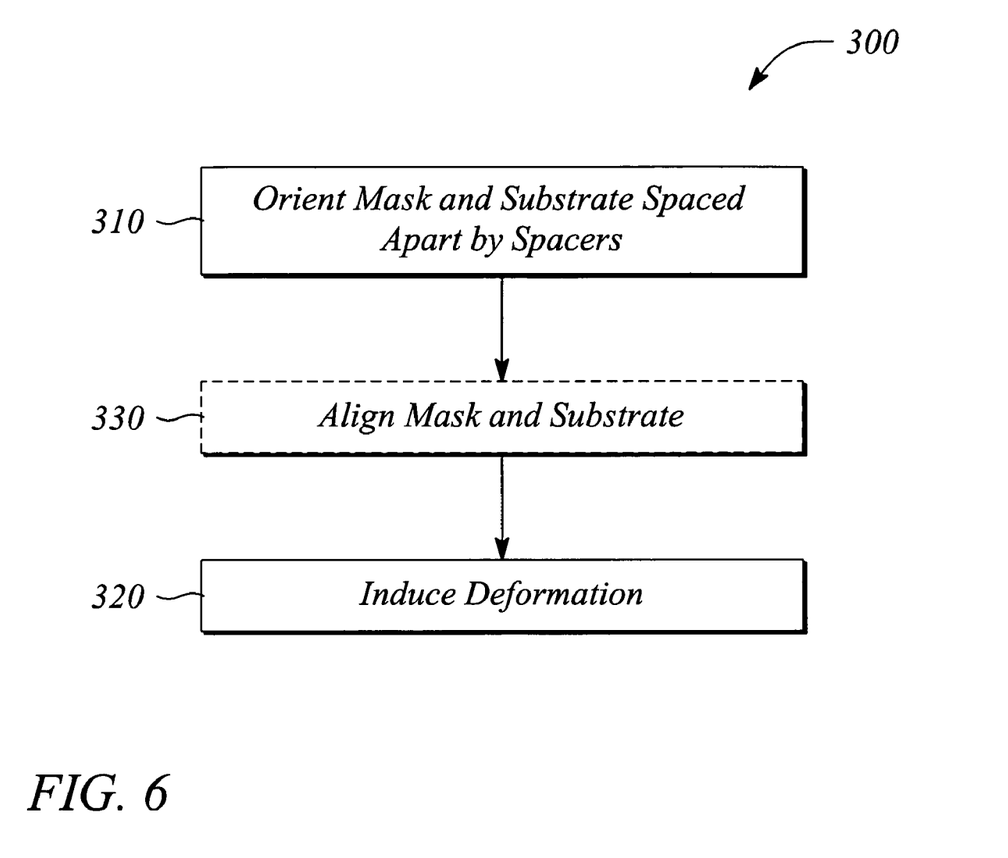
FIG. 6 illustrates a flow chart of a method of contact lithography according to an embodiment of the present invention.

FIG. 6 illustrates a flow chart of a method 300 of contact lithography according to an embodiment of the present invention. The method 300 comprises orienting 310 a patterning tool or 'mask' and a substrate being patterned in a spaced apart parallel relationship using dimensioned spacers. The spacers initially prevent direct contact between a patterned portion of the mask and a target portion of the substrate. For example, when oriented 310, a maximum feature height of the mask is spaced apart from or clears a maximum feature height of the substrate. In some embodiments, during and after orienting 310, the spacers further provide and maintain an essentially parallel relationship between the mask and the substrate. For example, a planar surface of the mask is made to be essentially parallel to a planar surface of the substrate by a relative spacing dimension (e.g., diameter or height) of the spacers after orienting 310.

The method 300 further comprises inducing 320 deformation of one or more of the mask, the substrate and the spacers, such that the patterned portion of the mask and the target portion of the substrate are brought into direct contact. Inducing 320 deformation comprises one or more of flexing the mask in a direction toward the substrate, flexing the substrate in a direction toward the mask, and deforming or collapsing the spacer. In all cases, the induced 320 deformation facilitates moving one or both of a portion of the mask and a portion of the substrate across a space created by the spacers during orienting 310. The facilitated movement brings the respective mask portion in direct contact with the respective substrate portion. In some embodiments, the mask is a lithographic mask employed in photolithographic patterning of the substrate while the mask is in the direct contact with the substrate or a pattern receiving layer of the substrate (e.g., optical contact lithography, X-ray contact lithography, etc.). In other embodiments, the mask is a mold employed in printing or impressing a pattern onto a pattern receiving surface of the substrate during the direct contact (e.g., imprint lithography). The direct contact resulting from the induced 320 deformation transfers a copy of the lithographic pattern to the substrate.

In some embodiments, the method 300 of contact lithography optionally further comprises aligning 330 the mask and the substrate following orienting 310 but prior to inducing 320 deformation. Performing an alignment 330 comprises one or more of lateral alignment and rotational alignment of one or both of the mask and the substrate relative to each other. In such embodiments, lateral alignment and/or rotational alignment comprises sliding one or both of the mask and the substrate on the spacers. An interface between the spacers and one or both of the mask and the substrate is slideable to facilitate sliding.

A standard state-of-the-art lithographic mask aligner usually brings the mask and the substrate into a parallel relationship with a typical separation of 5-10 microns (μm). If such an aligner is used for contact lithography, a typical drift and slip distance would be on the order of 0.5 μm. In nano-imprint lithography, features of 6 nanometers (nm) size have already been demonstrated, and the possibility exists to scale these features down to approximately 1 nm. Therefore, in a multi-step lithography, it may be desirable to have a contact lithography apparatus and methods that deliver alignment capabilities on the order of 1 nm. Embodiments of the present invention provide an apparatus and a method that meet or exceed these very stringent alignment constraints.

Thus, there have been described embodiments of an apparatus, a system and a method of contact lithography that employ spacers and flexure to achieve mask/substrate contact. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A contact lithography apparatus comprising:
   a mask having a patterned area with a lithographic pattern; and
   a spacer disposed between and affixed to one of the mask and a substrate being patterned, the spacer providing a spaced apart parallel and proximal orientation of the mask and the substrate when the mask and the substrate are in mutual contact with the spacer,
   wherein one or more of the mask, the substrate and the spacer is deformable, such that deformation facilitates pattern transfer.

2. The contact lithography apparatus of claim 1, wherein one or both of a lateral alignment and a rotational alignment of the parallel-oriented mask and substrate is facilitated by the mutual contact.

3. The contact lithography apparatus of claim 1, further comprising the substrate, the substrate having a target portion that receives the lithographic pattern.

4. The contact lithography apparatus of claim 1, wherein one or both of the mask and the substrate comprises the spacer, the spacer being fabricated as an integral part of one or both of the mask and the substrate.

5. The contact lithography apparatus of claim 1, wherein the spacer has a spacing dimension that creates a uniform space between the parallel-oriented mask and substrate, the spacing dimension being either a constant cross-sectional diameter of the spacer or a constant height of the spacer.

6. The contact lithography apparatus of claim 1, wherein the spacer is a member of a plurality of spacers between and affixed to one or both of the mask and the substrate, the spacers of the plurality having an equal spacing dimension that maintains a uniform space between the mask and the substrate in the parallel orientation.

7. The contact lithography apparatus of claim 1, wherein the spacer is one or more of plastically deformable, elastically deformable, passively deformable and actively deformable.

8. The contact lithography apparatus of claim 1, wherein a contact surface of the spacer is readily slidable on a contact surface of one of the mask and the substrate, a slidability being provided by either a material characteristic of the respective contact surfaces or by a low friction coating material applied to the respective contact surfaces.

9. The contact lithography apparatus of claim 8, wherein the contact surface of one or both of the mask and the substrate comprises areas of minimum local relief.

10. The contact lithography apparatus of claim 1, wherein one or both of the mask and the substrate is independently one or more of plastically deformable, elastically deformable, passively deformable, actively deformable and transparent.

11. The contact lithography apparatus of claim 1, further comprising means for causing the deformation that provides a contact pressure.

12. The contact lithography apparatus of claim 11, wherein the means for causing the deformation is one or more of a pressure, an electromagnetic force, and a temperature change.

13. The contact lithography apparatus of claim 1 used in a contact lithography system, the system comprising a contact mask aligner that aligns the parallel-oriented mask and substrate of the apparatus, the aligner supporting the apparatus during the deformation-facilitated pattern transfer.

14. A contact lithography apparatus comprising:
a mask having a patterned area with a lithographic pattern;
a substrate having a target portion that receives the lithographic pattern; and
a spacer disposed between and affixed to one of the mask and the substrate, the spacer providing a spaced apart parallel orientation of the mask and substrate when the mask and substrate are in mutual contact with the spacer,
wherein one or both of the mask and the substrate is deformable, such that deformation of one or both of the mask and the substrate toward the other facilitates transfer of the lithographic pattern to the substrate.

15. The contact lithography apparatus of claim 14, wherein one or both of the mask and the substrate is independently one or both of plastically deformable and elastically deformable.

16. The contact lithography apparatus of claim 14, wherein one or both of the mask and the substrate is independently one or both of passively deformable and actively deformable.

17. A contact lithography system comprising:
a contact lithography module comprising a spacer, a mask having a lithographic pattern and a substrate being patterned, the spacer being located between and in mutual contact with both the mask and the substrate during an alignment of the mask and the substrate; and
a contact mask aligner comprising a substrate chuck that holds and supports the substrate,
wherein the spacer provides a spaced apart parallel and proximal orientation of the mask and the substrate during the alignment by the contact mask aligner, a deformation in the contact lithography module providing a pattern transfer while the contact mask aligner holds the mask and the substrate in alignment.

18. The contact lithography system of claim 17, wherein the contact mask aligner further comprises a mask armature that holds and supports the mask, the mask armature and the substrate chuck providing and subsequently maintaining the alignment between the mask and the substrate in one or both of a lateral direction and a rotational direction during the pattern transfer.

19. The contact lithography system of claim 17, wherein one or more of the mask, the substrate and the spacer deform, such that the deformation produces a direct contact between the mask and the substrate to facilitate pattern transfer.

20. The contact lithography system of claim 17, wherein the spacer is deformable, such that deformation of the spacer in the module facilitates the pattern transfer.

21. The contact lithography system of claim 17, wherein one or both of the mask and the substrate are deformable, such that deformation of one or both of the mask and the substrate facilitates the pattern transfer.

22. The contact lithography system of claim 17, further comprising means for causing deformation that provides a contact pressure to the module.

23. The contact lithography system of claim 17, wherein the spacer is affixed to one of the mask and the substrate.

24. The contact lithography system of claim 17, wherein the spacer comprises a low friction material that renders the spacer readily slidable on a contact surface of one or both of the mask and the substrate.

25. A method of contact lithography comprising:
orienting a lithographic mask and a substrate being patterned in a spaced apart parallel relationship and proximal orientation using a dimensioned spacer disposed between and affixed to one of the mask and the substrate, the mask and the substrate being in mutual contact with the spacer; and
inducing a deformation of one or more of the mask, the substrate and the spacer such that the mask and the substrate are brought into direct contact for pattern transfer.

26. The method of contact lithography of claim 25, further comprising:
aligning the mask and the substrate before the deformation is induced, wherein aligning comprises one or both of a lateral alignment and a rotational alignment between the mask and the substrate while maintaining the parallel relationship.

27. The method of contact lithography of claim 26, wherein aligning comprises sliding one of the mask and the substrate on the spacer in one or both of a lateral direction and a rotational direction to align the mask and the substrate before inducing the deformation.

28. The method of contact lithography of claim 25, wherein inducing a deformation comprises one or more of flexing the mask, flexing the substrate and deforming the spacer to close a space between the mask and the substrate that is created by the spacer.

29. The method of contact lithography of claim 25, wherein inducing a deformation comprises flexing one or both of the mask and the substrate into a space created by the spacer while maintaining the mutual contact with the spacer.

30. The method of contact lithography of claim 25, wherein inducing a deformation comprises deforming the spacer to close a space between the mask and the substrate created by the spacer while maintaining the mutual contact with the spacer.

31. The method of contact lithography of claim 25, wherein the induced deformation is one or more of a plastic deformation, an elastic deformation, an active deformation and a passive deformation.

* * * * *